United States Patent
Lee et al.

(10) Patent No.: US 12,077,853 B2
(45) Date of Patent: Sep. 3, 2024

(54) METHOD OF GROWING TWO-DIMENSIONAL TRANSITION METAL CHALCOGENIDE FILM AND METHOD OF MANUFACTURING DEVICE INCLUDING THE SAME

(71) Applicants: Samsung Electronics Co., Ltd., Suwon-si (KR); RESEARCH & BUSINESS FOUNDATION SUNGKYUNKWAN UNIVERSITY, Gyeonggi-do (KR)

(72) Inventors: Hyangsook Lee, Suwon-si (KR); Hyoungsub Kim, Suwon-si (KR); Wonsik Ahn, Suwon-si (KR); Eunha Lee, Seoul (KR)

(73) Assignees: Samsung Electronics Co., Ltd., Gyeonggi-do (KR); RESEARCH & BUSINESS FOUNDATION SUNGKYUNKWAN UNIVERSITY, Suwen-si (KR)

( * ) Notice: Subject to any disclaimer, the term of this patent is extended or adjusted under 35 U.S.C. 154(b) by 794 days.

(21) Appl. No.: 17/132,111

(22) Filed: Dec. 23, 2020

(65) Prior Publication Data
US 2021/0388488 A1     Dec. 16, 2021

(30) Foreign Application Priority Data

Jun. 16, 2020 (KR) ........................ 10-2020-0073246

(51) Int. Cl.
C23C 16/30 (2006.01)
C23C 16/02 (2006.01)
(Continued)

(52) U.S. Cl.
CPC ........ *C23C 16/305* (2013.01); *C23C 16/0281* (2013.01); *C23C 16/45527* (2013.01);
(Continued)

(58) Field of Classification Search
CPC ......... H01L 21/28568; H01L 21/02568; C23C 16/45553; C23C 16/45527; C23C 16/0281; C23C 16/305
See application file for complete search history.

(56) References Cited

U.S. PATENT DOCUMENTS 9,644,263 B2    5/2017   Kim et al.
10,465,276 B2   11/2019   Robinson et al.
(Continued)

FOREIGN PATENT DOCUMENTS

KR          10-1535573 B1    7/2015
KR   10-2019-0024675 A    3/2019

OTHER PUBLICATIONS

Chemical vapor deposition, Wikipedia, https://en.wikipedia.org/wiki/Chemical_vapor_deposition, accessed Jan. 31, 2024.*
(Continued)

*Primary Examiner* — Kelly M Gambetta
(74) *Attorney, Agent, or Firm* — Harness, Dickey & Pierce, P.L.C.

(57) ABSTRACT

Provided are a method of growing a two-dimensional transition metal chalcogenide (TMC) film and a method of manufacturing a device including the two-dimensional TMC film. The method of growing a two-dimensional TMC film includes placing a metal layer having a predetermined pattern on a surface of a substrate; separately supplying a chalcogen precursor to a reaction chamber provided with the substrate; supplying a transition metal precursor to the reaction chamber; and evacuating the chalcogen precursor, the transition metal precursor, and by-products generated therefrom from the reaction chamber, wherein an amount of the chalcogen precursor and an amount of the transition metal precursor supplied to the reaction chamber may be controlled.

18 Claims, 13 Drawing Sheets

(51) Int. Cl.
  *C23C 16/455* (2006.01)
  *H01L 21/02* (2006.01)
  *H01L 21/285* (2006.01)

(52) U.S. Cl.
  CPC .. *C23C 16/45553* (2013.01); *H01L 21/02568* (2013.01); *H01L 21/28568* (2013.01)

(56) References Cited

U.S. PATENT DOCUMENTS

2016/0122868 A1* 5/2016 Kim .................. C23C 16/52
                                          427/255.35
2019/0131129 A1* 5/2019 Stinaff ............... H01L 21/0272

OTHER PUBLICATIONS

G. H. Han et al., "Seeded growth of highly crystalline molybdenum disulphide monolayers at controlled locations," Nature Communications, published Jan. 28, 2015.
B. Ryu et al., "Functional Inorganic Materials and Devices/Rubbing-Induced Site-Selective Growth (RISS) of MoS2 Device Patterns," Applied Materials and Interfaces, Published on Nov. 28, 2018 [Downloaded from http://pubs.acs.org on Nov. 28, 2018].
Notice of Non-Final Rejection issued May 27, 2024 in Korean Application No. 10-2020-0073246.

* cited by examiner

METHOD OF GROWING TWO-DIMENSIONAL TRANSITION METAL CHALCOGENIDE FILM AND METHOD OF MANUFACTURING DEVICE INCLUDING THE SAME

CROSS-REFERENCE TO RELATED APPLICATION

This application claims the benefit of Korean Patent Application No. 10-2020-0073246, filed on Jun. 16, 2020, in the Korean Intellectual Property Office, the disclosure of which is incorporated herein in its entirety by reference.

BACKGROUND

1. Field

The present disclosure relates to a method of growing a two-dimensional transition metal chalcogenide (TMC) film, a method of manufacturing a device including the two-dimensional TMC film, and a device including the two-dimensional TMC film.

2. Description of Related Art

A two-dimensional (2D) material is a single-layer or half-layer solid in which atoms form a crystal structure. A two-dimensional material may include a plurality of two-dimensional material layers, which may include various elements, units, and/or compounds arranged in a two-dimensional lattice. Though the atoms, units, and/or components comprising the two-dimensional layers may exist above and/or below a two-dimensional plane, the 2D lattice may comprise vertices ordered in a single sheet. A two dimensional material is in contrast to a one-dimensional material (e.g., a nanowire) and/or a three-dimensional material. For example, in the case of a crystalline and/or polycrystalline 3D material, a 3D material would include a 3D lattice structure comprising elements and/or compounds, defining crystal units, bonded with covalent, ionic, and/or metallic bounds.

An example of a typical two-dimensional material is graphene. Starting with research into graphene, research and development on various two-dimensional materials having semiconductor or insulator properties, like molybdenum disulfide ($MoS_2$) and bismuthene have been conducted. Two-dimensional materials are attracting the attention as next generation materials that may overcome the limitation of existing devices.

However, it is difficult to grow quality two-dimensional material to a uniform thickness on a wafer scale. Although methods of using metal organic precursors have been introduced to solve scalability problems (e.g., large area growth problems) when patterning the two-dimensional material on a wafer, there are still issues with the quality deterioration of the films and use of complicated process having several operational steps.

SUMMARY

Provided is a method of growing a two-dimensional transition metal chalcogenide (TMC) film, the method capable of securing uniformity and high quality by using a self-patterning method.

Provided is a method of growing a two-dimensional TMC film, the method capable of simultaneously depositing and etching the two-dimensional TMC film by controlling a supply time of a transition metal precursor.

Provided is a method of growing a two-dimensional TMC film, the method capable of controlling a deposition rate of the two-dimensional TMC film.

Provided is a method of manufacturing a device by applying a method of growing a two-dimensional TMC film.

Additional aspects will be set forth in part in the description which follows and, in part, will be apparent from the description, or may be learned by practice of the presented embodiments of the disclosure.

According to an aspect of an embodiment, provided is a method of growing a two-dimensional transition metal chalcogenide (TMC) film, the method including placing a patterned metal layer on a surface of a substrate; supplying a chalcogen precursor to a reaction chamber with the substrate; supplying 0.1 μg to 2 μg of a transition metal precursor to the reaction chamber; and evacuating the chalcogen precursor, the transition metal precursor, and by-products generated therefrom from the reaction chamber.

After the 0.1 μg to 2 μg of the transition metal precursor is supplied to the reaction chamber, the two-dimensional TMC film may be on only the metal layer.

The substrate may include at least one of Si, $SiO_2$, $Al_2O_3$, MgO, SiC, $Si_3N_4$, glass, quartz, sapphire, graphite, graphene, polyimide copolymer, polyimide, polyethylene naphthalate (PEN), fluoropolymer (FEP), polyethylene terephthalate (PET), and a TMC material.

The metal layer may include at least one selected from Al, Ni, Ti, Zr, Cr, Ta, Nb, and W.

The supplying of the chalcogen precursor; the supplying of the transition metal precursor; and the evacuating of the chalcogen precursor, the transition metal precursor, and the by-products generated therefrom may be periodically and repeatedly performed.

The periodic repetition may be performed 100 to 300 times.

A thickness of the two-dimensional TMC film may be in a range of about 1 nm to about 3 nm.

A reaction temperature for growth of the two-dimensional TMC film may be in a range of about 200° C. to about 600° C.

The chalcogen precursor may include a precursor material including at least one of S, Se, Te, Po, and Lv.

The transition metal precursor may include a precursor material including a metal element of Groups 4B, 5B, 6B, and 7B.

The transition metal precursor may include at least one of F, Cl, Br, and I.

A material of the two-dimensional TMC film may be represented by $MX_2$, wherein M may be one of Mo, W, Nb, V, Ta, Ti, Zr, Hf, Tc, and Re, and wherein X may be one of S, Se, Te, Po, and Lv.

The growing of the two-dimensional TMC film may use an atomic layer deposition (ALD) process.

At least one of the transition metal precursor and the chalcogen precursor may further include a precursor material of a doping element.

The two-dimensional TMC film may be formed on a wafer having a size of 6 inches or more.

According to another aspect of an embodiment, provided is a method of manufacturing a device containing a two-dimensional TMC film, the method including growing a two-dimensional TMC film on a substrate, the growing of the two-dimensional TMC film including placing a patterned metal layer on a surface of the substrate, supplying a chalcogen precursor to a reaction chamber with the substrate, supplying a transition metal precursor to the reaction chamber at a ratio of, by weight, $8*10^{-5}$ to $1.6*10^{-4}$ of the transition metal precursor to the chalcogen precursor, and evacuating the chalcogen precursor, the transition metal precursor, and by-products generated therefrom from the reaction chamber; and forming an electrode on the two-dimensional TMC film.

The device containing the two-dimensional TMC film may include at least one of a transistor, a diode, an optoelectronic device, a tunneling device, a logic device, and a memory device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
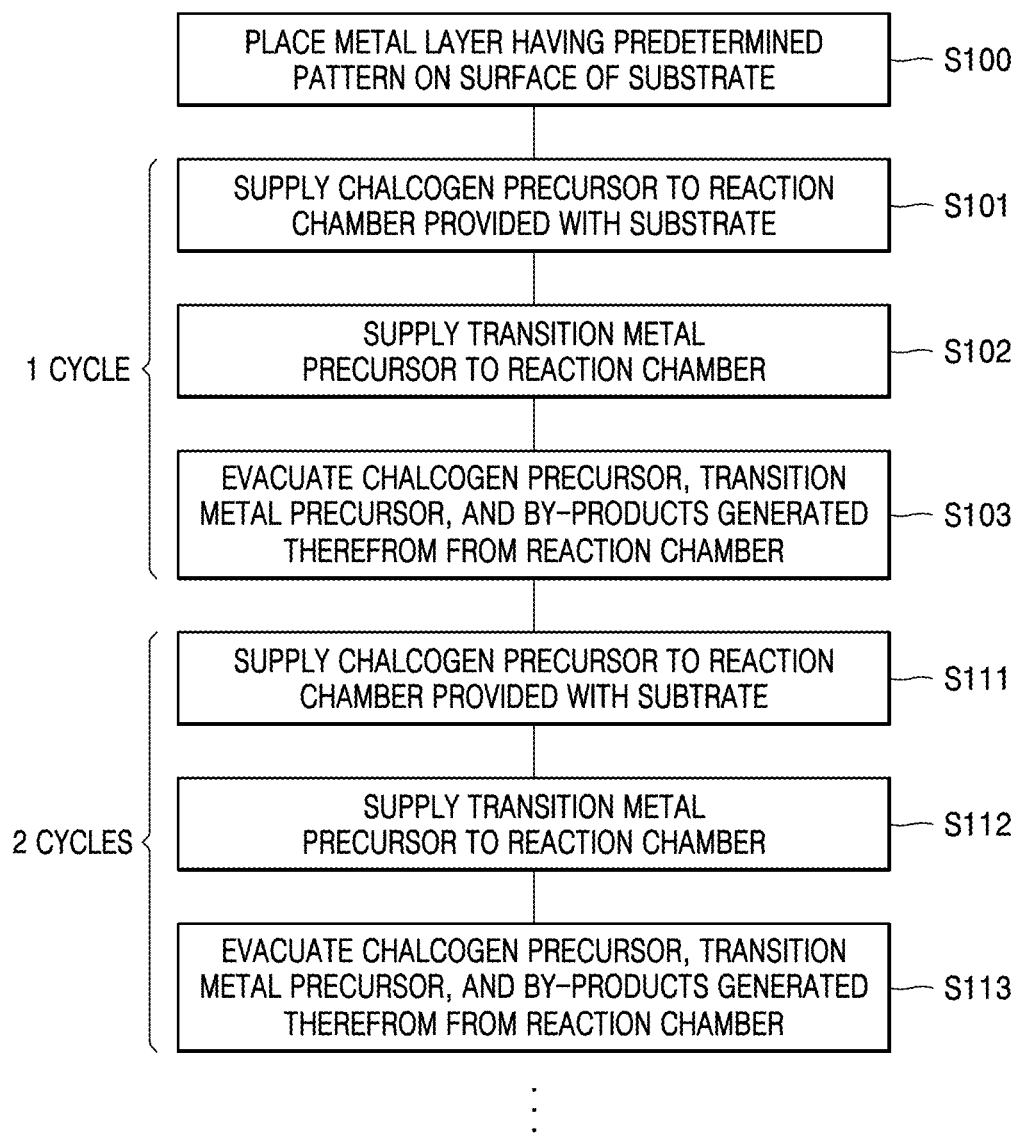
FIG. 1A is a flowchart illustrating a method of growing a two-dimensional transition metal chalcogenide (TMC) film, according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, according to one or more embodiments, a method of growing a two-dimensional transition metal chalcogenide (TMC) film and a method of manufacturing a device including the two-dimensional TMC film will be described in detail with reference to the accompanying drawings. The widths and thicknesses of layers or regions illustrated in the accompanying drawings may be exaggerated for clarity and ease of description. Like reference numerals in the drawings denote like elements.

Figure 1B:
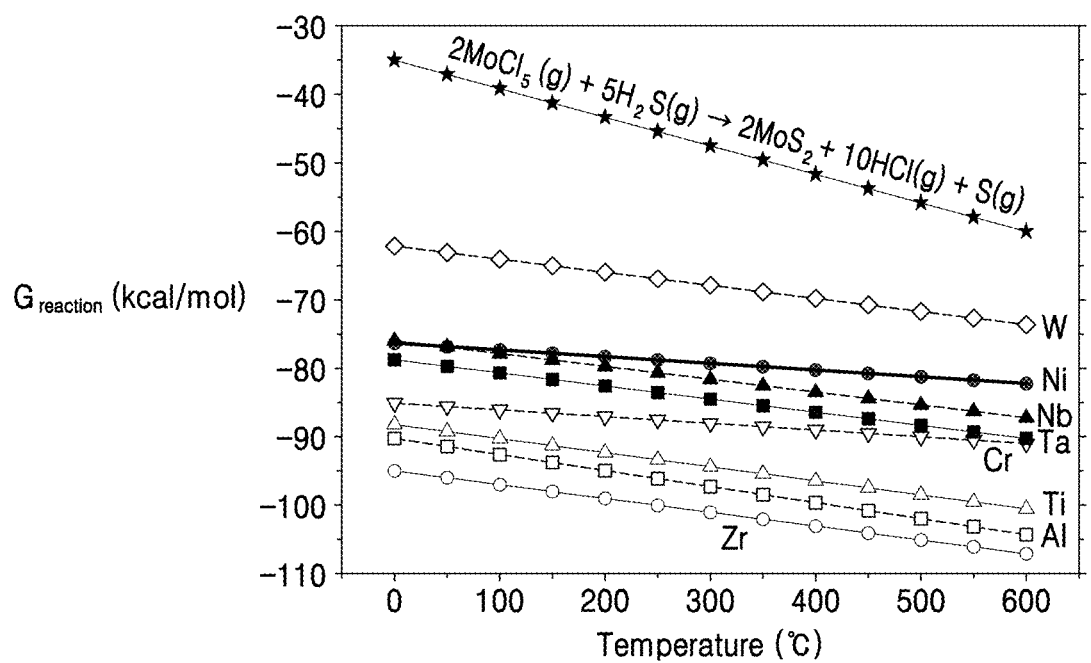
FIG. 1B is a graph showing Gibbs free energy needed for a material in a metal layer to synthesize $MoS_2$, according to an example embodiment.
Figure 2A:
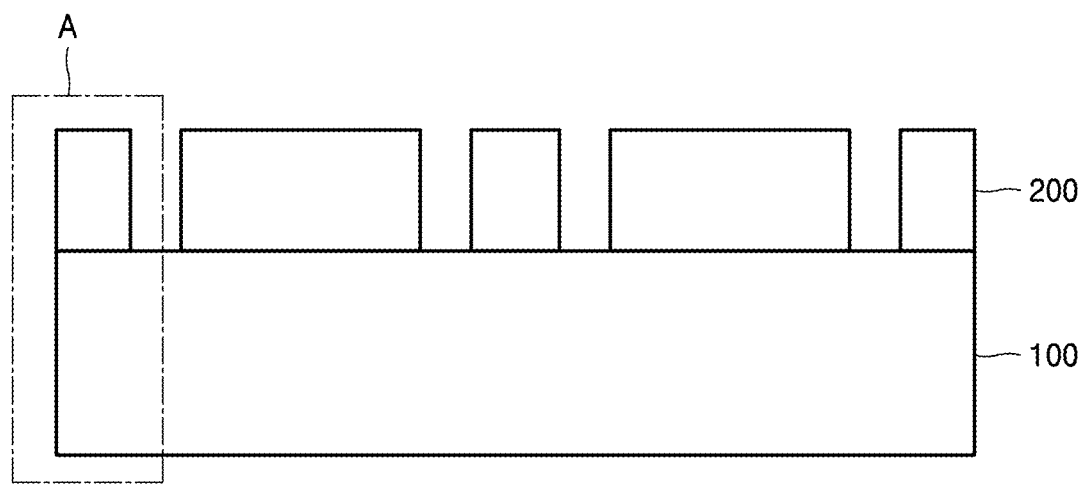
FIG. 2A is a cross-sectional view of a substrate on which a metal layer having a pattern is placed, according to an example embodiment.

FIG. 1A is a flowchart illustrating a method of growing a two-dimensional TMC film, according to an example embodiment. FIG. 1B is a graph showing the Gibbs free energy needed for a material in a metal layer to synthesize $MoS_2$, according to an example embodiment. FIG. 2A is a cross-sectional view of a substrate on which a metal layer having a pattern is placed, according to an embodiment. FIGS. 2B to 2F are enlarged cross-sectional views of region A of FIG. 2A that show operations of growing a two-dimensional TMC film using the method of growing a two-dimensional TMC film, according to an example embodiment.

Referring to FIGS. 1A and 1B, the method of growing a two-dimensional TMC film, according to an example embodiment, may include (S100) placing a metal layer 200 having a pattern on a surface of a substrate 100 for growing a film. For example, the pattern of metal layer 200 may include trenches in the exposed surface of the metal layer 200. The pattern of the metal layer 200 may be predetermined and/or may adjusted based on the conditions of growth, and/or a pattern for the two-dimensional TMC film. The substrate 100, according to an example embodiment, may support the metal layer 200. The substrate, however, may be patterned, and the metal layer 200 may be in or on the substrate 100. The pattern of the substrate may be the same and/or different from the pattern of the metal layer 200. In one embodiment, the substrate 100 may include a non-metallic material, for example a semiconductor, insulator, carbon-based material, and/or a polymer. For example the substrate 100 may include any one of Si, $SiO_2$, $Al_2O_3$, MgO, SiC, $Si_3N_4$, glass, quartz, sapphire, graphite, graphene, polyimide copolymer, polyimide, polyethylene naphthalate (PEN), fluoropolymer (FEP), polyethylene terephthalate (PET), and a TMC material. Here, the TMC material may be a heterogenous TMC material that is different from a material of the two-dimensional TMC film to be grown. A kind and material of the substrate 100 are not limited to those described above and may be varied. The two-dimensional TMC film may be formed on a wafer having a size of about 6 inches or more. For example, the substrate 100 may be a wafer having a size of about 6 inches or more. The method of growing a two-dimensional TMC film, according to an example embodiment, may be appropriate for large area growth. According to an example embodiment the method may also be applied to a substrate having a size of 6 inches or less.

The metal layer 200 according to an example embodiment may be placed on the substrate 100. Here, the metal layer 200 has a pattern, and the two-dimensional TMC film placed on the metal layer 200 may also have a pattern. For example, the two-dimensional TMC film may have a predetermined pattern. The metal layer 200 according to an example embodiment may include a material having better reactivity with respect to a transition metal precursor than that of the substrate 100. For example, the metal layer 200 may include a material having lower Gibbs free energy for the synthesis of the two-dimensional TMC film in comparison to the substrate 100. In one example embodiment, the metal layer 200 may include a material having low Gibbs free energy suitable for $MoS_2$ synthesis. For example, the metal layer 200 may include at least one selected from Al, Ni, Ti, Zr, Cr, Ta, Nb, and W.

As shown in FIG. 1B, when aluminum (Al), nickel (Ni), titanium (Ti), zirconium (Zr), chromium (Cr), tantalum (Ta), niobium (Nb), and/or tungsten (W) reacts with a chalcogen precursor (e.g., $H_2S$) and a transition metal precursor (e.g., $MoCl_5$) the Gibbs free energy for the synthesis of the TMC (e.g., $MoS_2$) may be lower than the Gibbs free energy needed for the synthesis of the TMC on the substrate 100 not including Al, Ni, Ti, Zr, Cr, Ta, Nb, or W.

A synthesis formula to obtain Gibbs free energy needed for $MoS_2$ synthesis on the substrate 100 is as follows:

$2MoCl_5(g)+5H_2S(g) \rightarrow 2MoS_2(s)+10HCl(g)+S(g)$.

Also, synthesis formulae to obtain Gibbs free energy needed for $MoS_2$ synthesis on an example metal layer 200 include at least one selected from Al, Ni, Ti, Zr, Cr, Ta, Nb, and W is as follows:

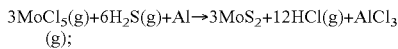
$3MoCl_5(g)+6H_2S(g)+Al \rightarrow 3MoS_2+12HCl(g)+AlCl_3(g)$;

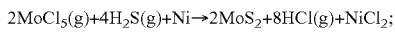
$2MoCl_5(g)+4H_2S(g)+Ni \rightarrow 2MoS_2+8HCl(g)+NiCl_2$;

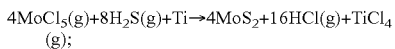
$4MoCl_5(g)+8H_2S(g)+Ti \rightarrow 4MoS_2+16HCl(g)+TiCl_4(g)$;

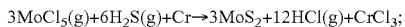
$3MoCl_5(g)+6H_2S(g)+Cr \rightarrow 3MoS_2+12HCl(g)+CrCl_3$;

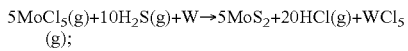
$5MoCl_5(g)+10H_2S(g)+W \rightarrow 5MoS_2+20HCl(g)+WCl_5(g)$;

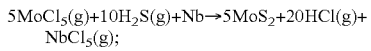
$5MoCl_5(g)+10H_2S(g)+Nb \rightarrow 5MoS_2+20HCl(g)+NbCl_5(g)$;

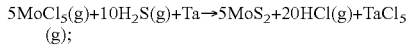
$5MoCl_5(g)+10H_2S(g)+Ta \rightarrow 5MoS_2+20HCl(g)+TaCl_5(g)$;

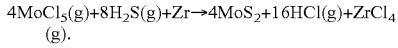
$4MoCl_5(g)+8H_2S(g)+Zr \rightarrow 4MoS_2+16HCl(g)+ZrCl_4(g)$.

The metal layer 200 according to an example embodiment may be placed on the substrate 100 using vapor deposition method, for example, a physical vapor deposition (PVD) process, a chemical vapor deposition (CVD) process, a plasma enhanced chemical vapor deposition (PECVD) process, a metal organic chemical vapor deposition (MOCVD) process, or a combination of at least two selected therefrom. However, embodiments are not limited thereto, and a process capable of placing a metal layer 200 on a substrate 100 so as to have a pattern may be applied.

Referring back to FIG. 1A, a chalcogen precursor may be supplied to a reaction chamber provided with the substrate 100 and the metal layer 200 according to an embodiment. (S101). In one embodiment, the chalcogen precursor may include one precursor material selected from chalcogen elements, for example at least one of S, Se, and Te. The chalcogen precursor may further include a precursor material of at least one doping element.

Next, a transition metal precursor may be separately supplied to the reaction chamber provided with the substrate 100 and the metal layer 200 (S102). In one example embodiment, the transition metal precursor may include at least one precursor material selected from Group 4B, 5B, 6B, and 7B metal elements. The transition metal precursor may further include a precursor material of at least one doping element.

In one embodiment, the transition metal precursor may be supplied separately from the chalcogen precursor. Supplying separately may mean sequentially supplying the chalcogen precursor and the transition metal precursor. For example, the chalcogen precursor material may be supplied first, and then, the transition metal precursor material may be subsequently supplied. The supply of transition metal precursor material to the reaction chamber may being after the supply of the chalcogen precursor material has ended or may partially overlap the supply of the chalcogen precursor material.

In an operation of supplying a chalcogen precursor (S101) and an operation of supplying a transition metal precursor (S102), a supply amount of the transition metal precursor may be appropriately selected, for example, based on the amount of chalcogen precursor previously supplied and/or an amount of TMC to be synthesized. In one example embodiment, as a sufficient amount of the chalcogen precursor is supplied to the reaction chamber in the operation of supplying a chalcogen precursor (S101), when the supply amount of the transition metal precursor supplied to the operation of supplying a transition metal precursor (S102) is in a range of about 0.1 μg or more to about 2 μg or less, a two-dimensional TMC film 300 may be produced. In one example embodiment, when 12.5 mg of the chalcogen precursor is supplied, a ratio of transition metal precursor/chalcogen precursor may be about $8*10^{-6}$ or greater and/or about $1.6*10^{-4}$ or less. For example, the mass ratio of transition metal precursor to chalcogen precursor supplied to the reaction chamber may be within the range of about $8*10^{-6}$ to $1.6*10^{-4}$.

For example, when a supply amount of the transition metal precursor being supplied in the operation of supplying a transition metal precursor (S102) is about 1 μg or more to about 2 μg or less, the two-dimensional TMC film 300 may be produced only on an upper surface of the metal layer 200. For example, when 12.5 mg of the chalcogen precursor is supplied to the reaction chamber, the ratio of transition metal precursor/chalcogen precursor capable of producing the two-dimensional TMC film 300 only on the metal layer 200 may be in a range of about $8*10^{-5}$ to about $1.6*10^{-4}$. However, embodiments are not limited thereto, and when structures of the reaction chambers are different; a supply amount of the chalcogen precursor and a supply amount of the transition metal precursor may be different from each other.

Figure 2B:
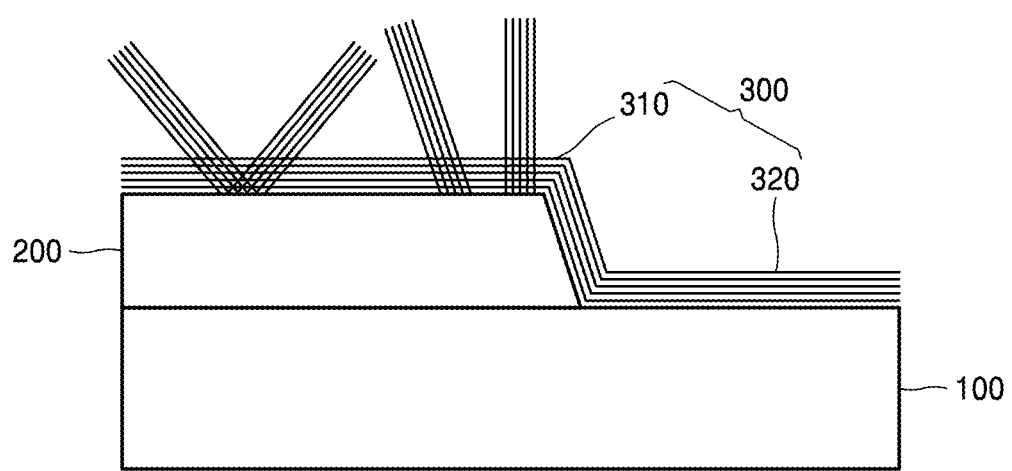
FIGS. 2B to 2F are enlarged cross-sectional views of region A in FIG. 2A that show operations of growing a two-dimensional TMC film using the method of growing a two-dimensional TMC film, according to an example embodiment.

As the operation of supplying a chalcogen precursor (S101) and the operation of supplying a transition metal precursor (S102) are alternately and repeatedly performed, a two-dimensional TMC film 300 may be removed after being formed on the metal layer 200 and being grown on the substrate 100. Here, a reaction temperature for growth and removal of the two-dimensional TMC film 300 may be, for example, in a range of about 200° C. to about 600° C. For example, the temperature of the substrate 100 and the metal layer 200 in the growing process of the two-dimensional TMC film 300 may be maintained in a range of about 200° C. to about 600° C. For example, the substrate may be directly and/or indirectly heated using a heating plate and/or coil. However, this temperature range may vary. As described above, by controlling the supply amount of the chalcogen precursor and the supply amount of the transition metal precursor, the two-dimensional TMC film 300 may be removed after being formed on the metal layer 200 and being grown on the substrate 100. Referring to FIG. 2B, when a transition metal precursor is supplied to a reaction chamber, a two-dimensional TMC film 300 may be formed on a substrate 100 and a metal layer 200. For example, when 12.5 mg of $H_2S$, as a chalcogen precursor, is injected to the reaction chamber at a rate of 2.5 mg/s for 5 seconds, and then 0.338 μg of $MoCl_5$, as a transition metal precursor, is injected to the reaction chamber at a rate of 20.30 μg/min for 1 second:

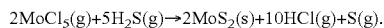

$2MoCl_5(g)+5H_2S(g) \rightarrow 2MoS_2(s)+10HCl(g)+S(g)$.

As shown in this formula, the two-dimensional TMC film 300 (e.g., a $MoS_2$ film) may be formed on the substrate 100 and the metal layer 200. Here, the transition metal precursor may be supplied at 100° C. and atmospheric pressure.

In one example embodiment, the two-dimensional TMC film 300 may be grown using an atomic layer deposition (ALD) process. Here, because the substrate 100 and the metal layer 200 have reactivities different from each other with respect to $MoCl_5$, as the transition metal precursor, thicknesses and shapes of a first two-dimensional TMC film 310 on the metal layer 200 and a second two-dimensional TMC film 320 on the substrate 100 may be different from each other. For example, a thickness of the first two-dimensional TMC film 310 on the metal layer 200 may be greater than a thickness of the second two-dimensional TMC film 320 on the substrate 100.

Figure 2C:
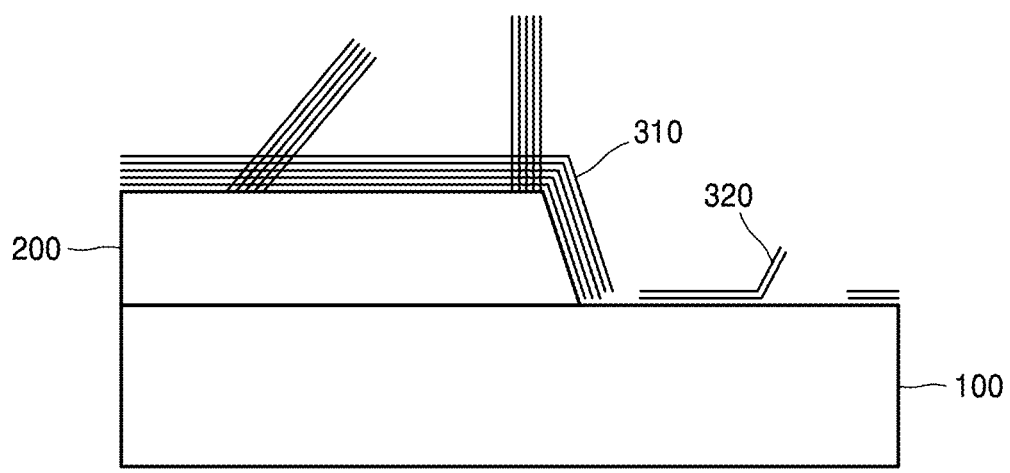

Referring to FIG. 2C, when more than the transition metal precursor in FIG. 2B is supplied to the reaction chamber, the oversupplied residual transition metal precursor may remove the two-dimensional TMC film 300 formed on the substrate 100 and the metal layer 200. For example, when 12.5 mg of $H_2S$, as a chalcogen precursor, is injected to the reaction chamber at a rate of about 2.5 mg/s for 5 seconds, and then 0.677 μg $MoCl_5$, as a transition metal precursor, is injected to the reaction chamber at a rate of about 20.30 μg/min for 2 seconds, the oversupplied $MoCl_5$ may react with the $MoS_2$, as shown in this formula:

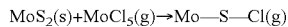

$MoS_2(s)+MoCl_5(g) \rightarrow Mo-S-Cl(g)$

Thereby, the oversupplied $MoCl_5$ may etch the $MoS_2$ film formed on the substrate 100 and the metal layer 200. The oversupplied $MoCl_5$ may etch irregular structures formed on a surface of the first two-dimensional TMC film 310 and, thus, may etch the surface of the first two-dimensional TMC film 310 to be more uniform. Also, the oversupplied $MoCl_5$ may etch and remove a part of the second two-dimensional TMC film 320 on the substrate 100.

Figure 2D:
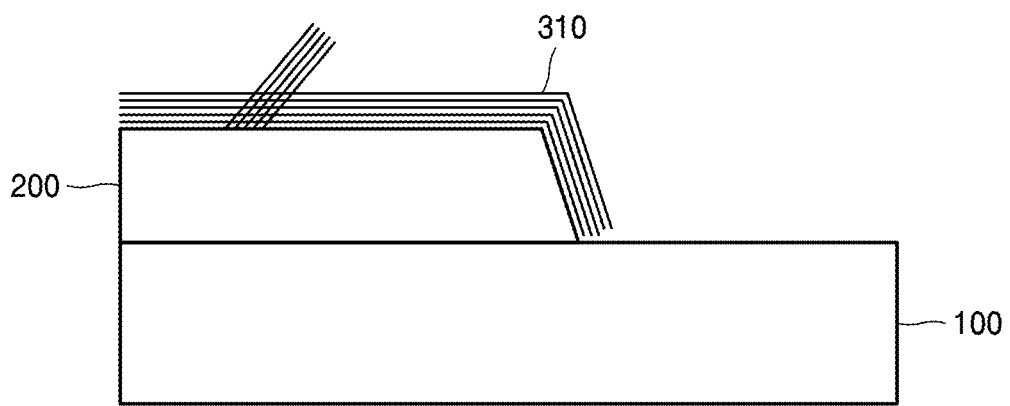

Referring to FIG. 2D, for example, when more of the transition metal precursor is supplied to the reaction chamber more than that in FIG. 2C, the oversupplied residual transition metal precursor may additionally remove the two-dimensional TMC film 300 formed on the substrate 100 and the metal layer 200.

For example, when 12.5 mg of $H_2S$, as a chalcogen precursor, is injected to the reaction chamber at a rate of 2.5 mg/s for 5 seconds, and then 1.184 μg of $MoCl_5$, as a transition metal precursor, is injected to the reaction chamber at a rate of 20.30 μg/min for 3.5 seconds, the oversupplied $MoCl_5$ may etch the $MoS_2$ film formed on the substrate 100 and the metal layer 200. In this regard, the overly supplied $MoCl_5$ may etch an irregular structure formed on a surface of the first two-dimensional TMC film 310 and thus may etch the surface of the first two-dimensional TMC film 310 to be further uniform. Also, here, as described with respect to FIG. 2B, a thickness of the first two-dimensional TMC film 310 placed on the metal layer 200 may be greater than a thickness of the second two-dimensional TMC film 320 placed on the substrate 100 due to different reactivities of the substrate 100 and the metal layer 200 with respect to $MoCl_5$, as a transition metal precursor. In this regard, the overly supplied $MoCl_5$ may completely etch the second two-dimensional TMC film 320. Thus, the two-dimensional TMC film 300 according to an example embodiment may be only on the metal layer 200 having a pattern. Accordingly, the two-dimensional TMC film 300 may be formed on the substrate 100 in a patterned form.

Figure 2E:
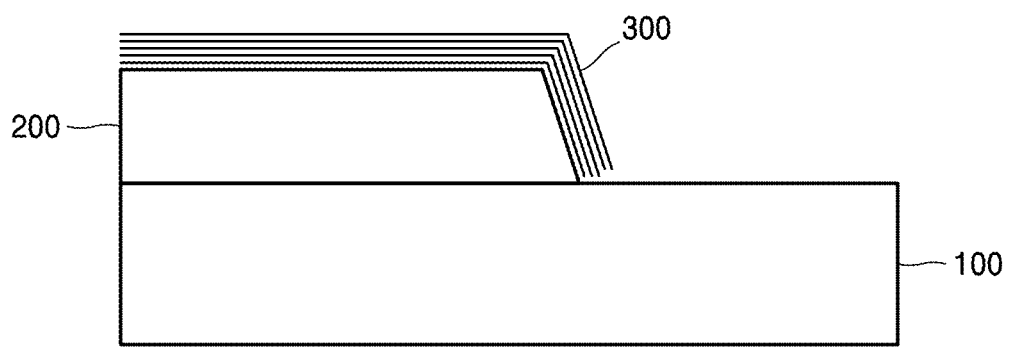

Referring to FIG. 2E, when more of the transition metal precursor is supplied to the reaction chamber more than that in FIG. 2D, the overly supplied residual transition metal precursor may additionally etch one surface of the two-dimensional TMC film 300 formed on the metal layer 200. For example, when 12.5 mg of $H_2S$, as a chalcogen precursor, is injected to the reaction chamber at a rate of about 2.5 mg/s for 5 seconds, and then 1.692 μg of $MoCl_5$, as a transition metal precursor, is injected to the reaction chamber at a rate of 20.30 μg/min for 5 seconds, the overly supplied $MoCl_5$ may etch the $MoS_2$ film formed on the metal layer 200. In this regard, the overly supplied $MoCl_5$ may etch an irregular structure remaining on a surface of the first two-dimensional TMC film 310 and thus may increase uniformity of the surface of the first two-dimensional TMC film 310.

Next, referring back to FIG. 1A, the chalcogen precursor, the transition metal precursor, and by-products generated therefrom remaining in the reaction chamber may be evacuated (S103). An evacuating operation may be, for example, a vacuum evacuating operation. The evacuating operation may include an evacuation process using a vacuum pump connected to the reaction chamber while injecting an inert gas such as $N_2$ gas to the reaction chamber. Thereby, the precursors and the by-products generated therefrom may be evacuated from the reaction chamber.

As described above, by controlling a supply ratio of the chalcogen precursor and the transition metal precursor, a self-patterning process through which the two-dimensional TMC film 300 is placed only on an upper part of the metal layer 200 following the pattern of the metal layer 200 may be performed. Also, by controlling a supply ratio of the chalcogen precursor and the transition metal precursor, uniformity of the two-dimensional TMC film 300 placed on the metal layer 200 may be controlled.

In one example embodiment, when the two-dimensional TMC film 300 is patterned only on the metal layer 200 following a pattern of the metal layer 200, and a supply ratio of a chalcogen precursor and a transition metal precursor capable of forming a uniform two-dimensional TMC film 300 is determined, as described in FIG. 1A, an operation of supplying a chalcogen precursor (S111), an operation of separately supplying a transition metal precursor (S112), and an operation of evacuating the chalcogen precursor, the transition metal precursor, and by-products generated therefrom (S113) may be periodically performed.

Figure 2F:
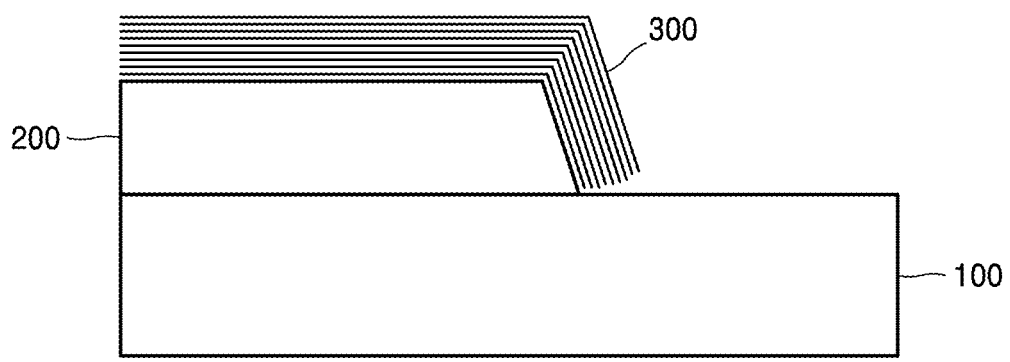

In one example embodiment, as the supplying of the chalcogen precursor and the transition metal precursor and the evacuating of the chalcogen precursor, the transition metal precursor, and by-products generated therefrom are periodically performed, as shown in FIG. 2F, a thickness of the two dimensional TMC film 300 placed on an upper part of the metal layer 200 may increase. In one embodiment, the supplying of the chalcogen precursor and the transition metal precursor and the evacuating of the chalcogen precursor, the transition metal precursor, and by-products generated therefrom may be performed 100 times or more and/or 300 times or less. For example, the supplying of the chalcogen precursor and the transition metal precursor and the evacuating of the chalcogen precursor, the transition metal precursor, and by-products generated therefrom may be performed between about 100 times to about 300. For example, when the periodically repeating operations are performed 100 times to 300 times, the two-dimensional TMC film 300 may have a thickness in a range of about 1 nm to about 3 nm. However, embodiments are not limited thereto, and the periodically repeating operations may be changed according to the thickness of the two-dimensional TMC film 300.

The operation may be performed in an apparatus including a reaction chamber configured to receive a substrate. For example, the apparatus may include a robot arm configured to move the substrate into and out of the reaction chamber. The apparatus may include a chalcogen precursor supply, a transition metal precursor supply, and/or a metal vapor source connected to the reaction chamber. The apparatus may include a controller configured to control the operation of the apparatus, for example the amounts of materials supplied to the reaction chamber, and/or the timing of operations S101-S103 and S111-S113. The controller may include processing circuitry such hardware including logic circuits; a hardware/software combination such as a processor executing software; or a combination thereof. For example, the processing circuity more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

A material of the two-dimensional TMC film 300 thus formed using the method described above may be represented by $MX_2$. Here, M may be a transition metal, for example at least one of Mo, W, Nb, V, Ta, Ti, Zr, Hf, Tc, and Re, and X may be a chalcogen, for example at least one of S, Se, and Te. Examples of the two-dimensional TMC film 300 may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, and/or $ReSe_2$. The two-dimensional TMC film 300 may be include a two-dimensional (2D) material. The 2D material may be a single-layer or half-layer solid in which atoms form a crystal structure. The 2D material may have a layered structure. Electronically, the 2D material may have a density of state (DOS) following a quantum well behavior. Because the DOS may follow a quantum well behavior in a plurality of 2D unit material layers (a single layer) the structure in which the single layer is repeatedly stacked may be referred to as "2D material." Interlayers of the 2D material may be bonded by van der Waals forces.

The two-dimensional TMC film 300 formed in this regard may further include a doping element (A), and, in this case, the doped two-dimensional TMC film 300 may be represented by A-doped $MX_2$ or $AMX_2$. $AMX_2$ may represent, for example, the stoichiometric formula of $A_xM_{1-x}X_2$. The doping element (A) may be a metal (e.g., a transition metal). An amount of the doping element (A) may be about 5 weight % (wt %) or lower of the TMC film 300. For example, the TMC film 300 may include about 2 wt % or lower of doping element.

As described above, according to an example embodiment, the two-dimensional TMC film 300 having a uniform surface and a pattern may be formed in a large area using a simple process. For example, because the self-patterning process is used, a process operation may be simplified in a formation process of the two-dimensional TMC film 300, and a process yield of the two-dimensional TMC film 300 may improve. Also, as the thickness of the two-dimensional TMC film 300 is uniform, the two-dimensional TMC film 300 may be formed having excellent quality. For example, when the two-dimensional TMC film 300 is formed on a 6-inch wafer, the two-dimensional TMC film 300 of a uniform thickness may be formed on a pattern. Thus, the present embodiment may be positively applied to development and commercialization of a device to which the two-dimensional TMC film 300 is applied.

In comparison, when a conventional method is used, a two-dimensional TMC film may not be grown in a patterned shape, and the uniformity of the two-dimensional TMC film may not be secured. However, according to an example embodiment, a two-dimensional TMC film of high quality may be formed in a short period of time using a simple process while patterning the two-dimensional TMC film and securing universal film uniformity of the film.

Figure 3A:
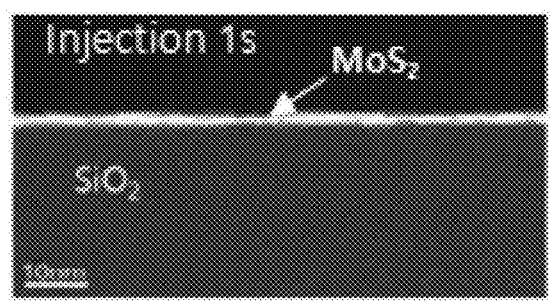
FIGS. 3A and 3B are transmission electron microscope (TEM) cross-sectional images showing growth of a two-dimensional TMC film on a substrate, according to an example embodiment.
Figure 3B:
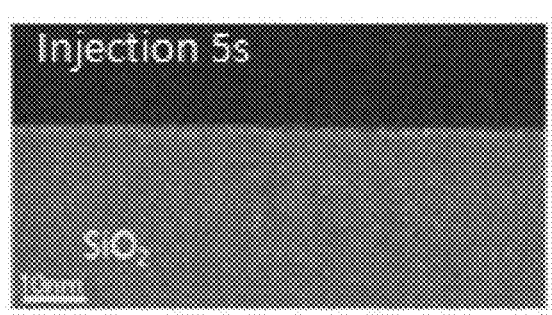
Figure 3C:
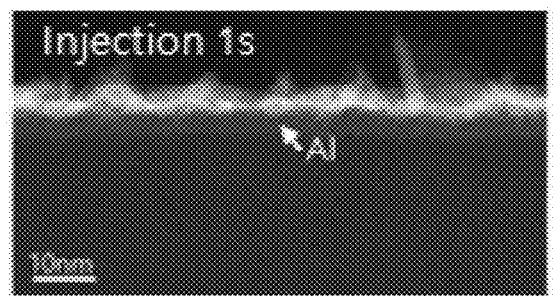
FIGS. 3C and 3D are TEM cross-sectional images showing growth of a two-dimensional TMC film on a metal layer, according to an example embodiment.
Figure 3D:
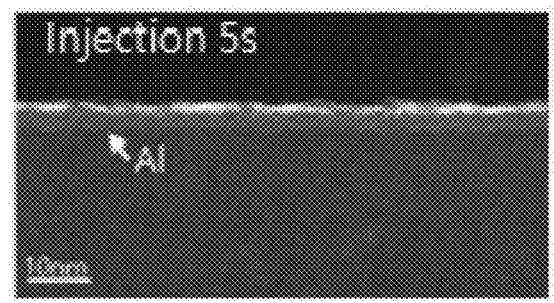
Figure 4A:
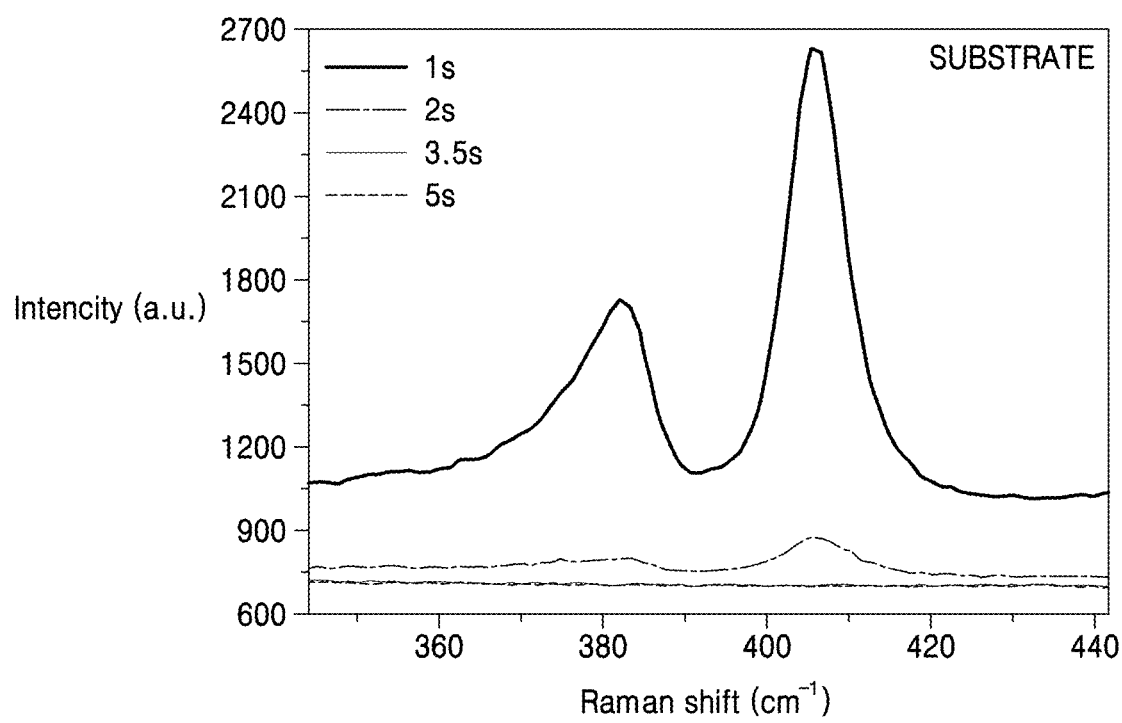
FIG. 4A shows a Raman spectrum of a substrate, according to an example embodiment.
Figure 4B:
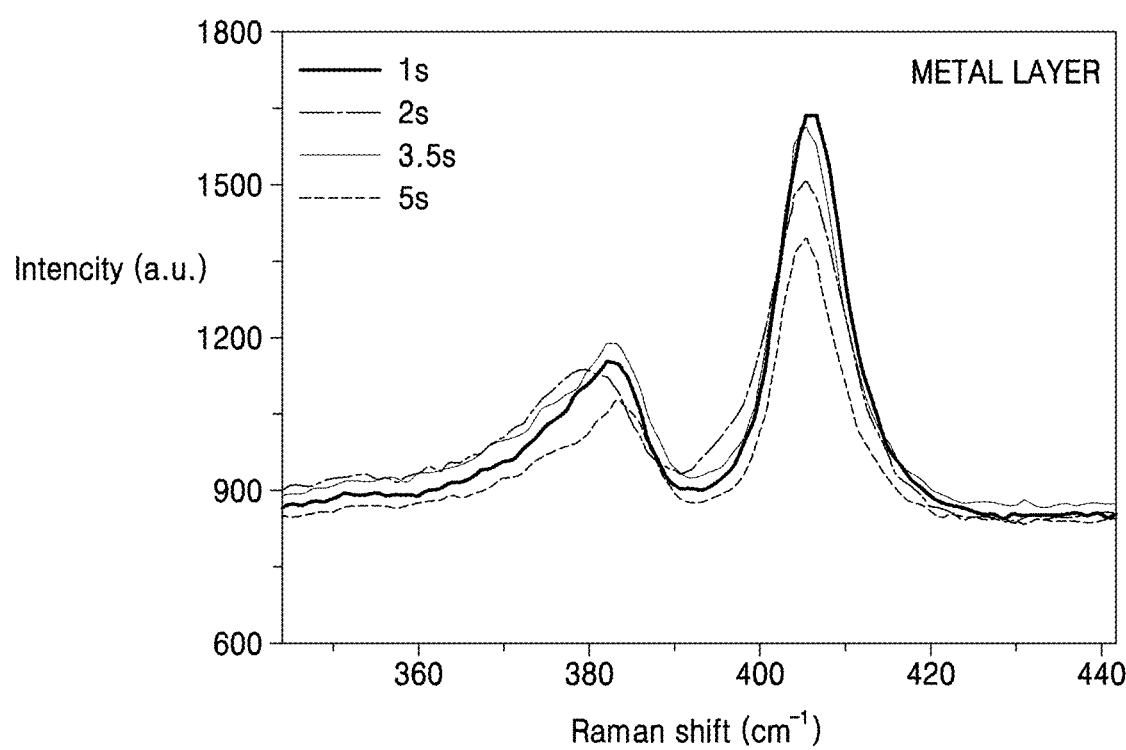
FIG. 4B shows a Raman spectrum of a metal layer, according to an example embodiment.

FIGS. 3A and 3B are transmission electron microscope (TEM) cross-sectional images showing growth of a two-dimensional TMC film on a substrate, according to an example embodiment. FIGS. 3C and 3D are TEM cross-sectional images showing growth of a two-dimensional TMC film on a metal layer, according to an example embodiment. Each of the FIGS. 3A and 3C includes the corresponding TEM cross-sectional image of FIGS. 3B and 3D, and what appears as a line in the middle of the TEM image of FIGS. 3A, 3C, and 3D is a two-dimensional TMC film. FIG. 4A shows a Raman spectrum of a substrate, according to an example embodiment. FIG. 4B shows a Raman spectrum of a metal layer, according to an example embodiment.

In the TEM images of FIGS. 3A and 3B, a bottom material layer, for example under the two-dimensional TMC film in FIG. 3A, is a substrate. In the TEM images of FIGS. 3C and 3D, a material layer under the two-dimensional TMC film is an aluminum metal layer. FIG. 4A shows a Raman spectrum of a substrate according to a time of supplying a transition metal precursor. FIG. 4B shows a Raman spectrum of a metal layer according to a time of supplying a transition metal precursor.

In FIGS. 3A and 3C, $H_2S$, as a chalcogen precursor, is injected to the reaction chamber for 5 seconds, and then $MoCl_5$, as a transition metal precursor, is injected to the reaction chamber for 1 second. In FIGS. 3B and 3D, $H_2S$, as a chalcogen precursor, is injected to the reaction chamber for 5 seconds, and then $MoCl_5$, as a transition metal precursor, is injected to the reaction chamber for 5 seconds.

Referring to FIGS. 3A to 3D, an irregular two-dimensional TMC film may be formed on a substrate and a metal layer when the time for supplying the transition metal precursor is short. On the other hand, it may be confirmed, referring to FIG. 3B, that the two-dimensional TMC film on the substrate may be removed as a time of supplying the transition metal precursor increases. In fact, referring to FIG. 4A, it may be confirmed that a region having a Raman intensity peak of the two-dimensional TMC film on the substrate decreases as the time of supplying a transition metal precursor increases. On the other hand, referring to FIG. 4B, it may be confirmed that a region having a Raman intensity peak of the two-dimensional TMC film on the metal layer may be maintained when a time of supplying a transition metal precursor increases. Further, it may be confirmed, referring to FIG. 3D, that uniformity of the two-dimensional TMC film placed on the metal layer improves when a time of supplying a transition metal precursor is longer than a time of supplying a chalcogen precursor.

According to an example embodiment, a two-dimensional TMC film having a pattern and uniformity may be formed only on the metal layer by controlling a time of supplying a transition metal precursor.

Figure 5A:
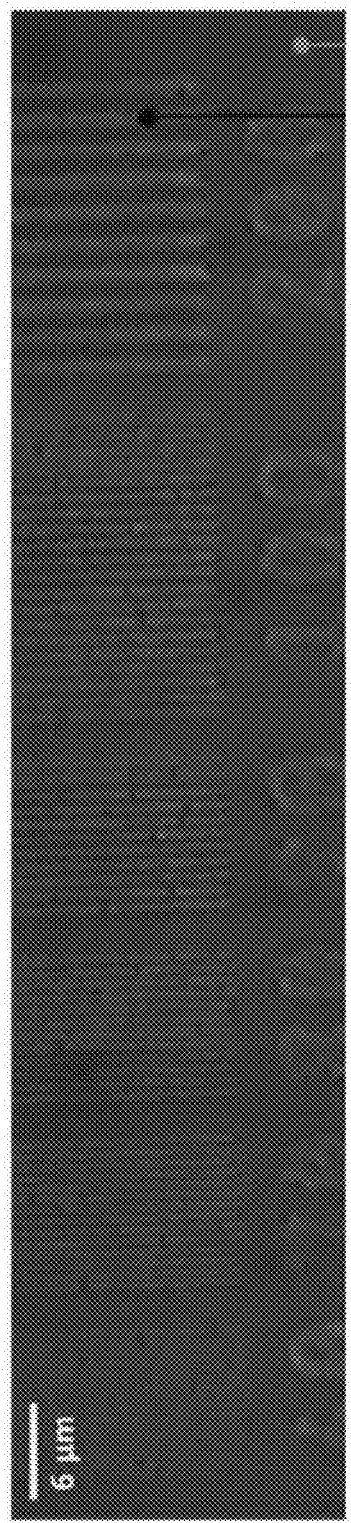
FIG. 5A shows a TEM image of a metal layer placed on a substrate, wherein a two-dimensional TMC film is patterned on the metal layer, according to an example embodiment.
Figure 5B:
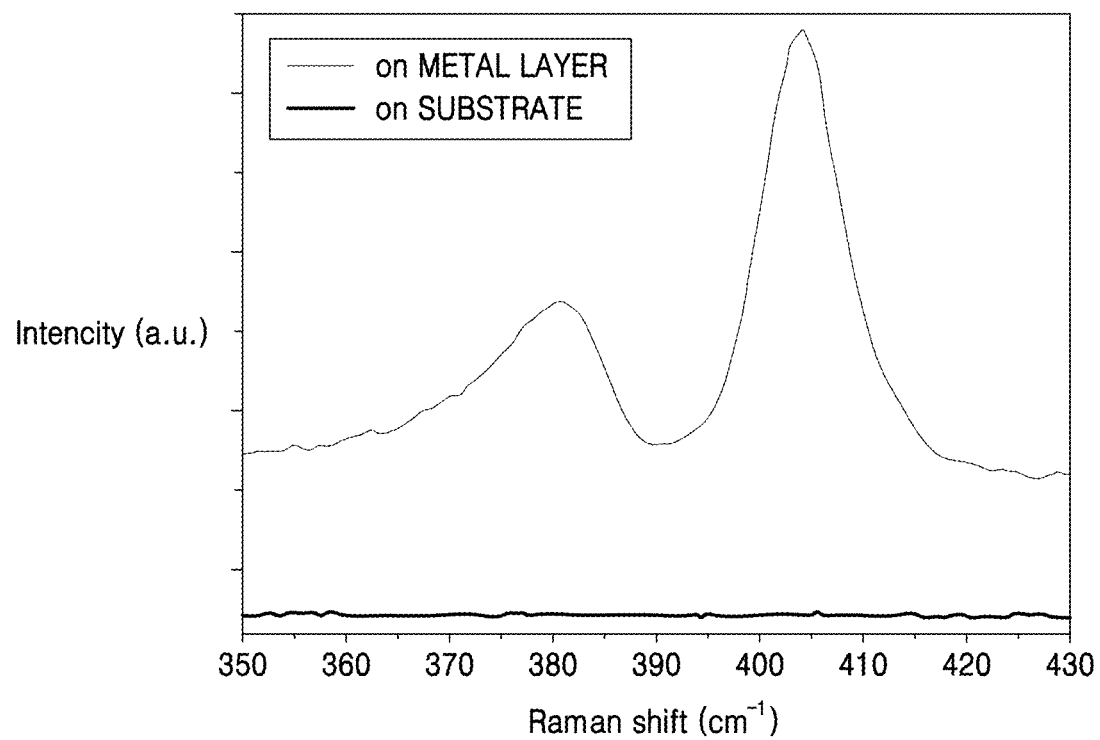
FIG. 5B shows a Raman spectrum of a substrate region and a metal layer region shown in FIG. 5A.
Figure 5C:
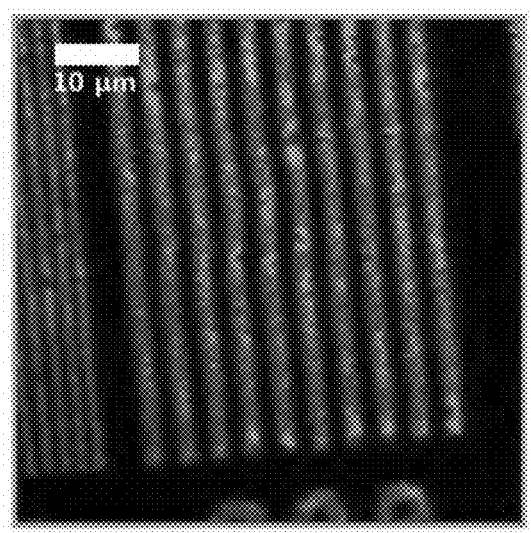
FIG. 5C is a synthetic image resulting by synthesizing a patterned image of the two-dimensional TMC film based on the Raman spectrum of FIG. 5B.

FIG. 5A shows a TEM image of a metal layer placed on a substrate, wherein a two-dimensional TMC film is patterned on the metal layer, according to an example embodiment. FIG. 5B shows a Raman spectrum of a substrate region and a metal layer region shown in FIG. 5A. FIG. 5C is a synthetic image resulting by synthesizing a patterned image of the two-dimensional TMC film based on the Raman spectrum of FIG. 5B.

In the TEM image of FIG. 5A, an unprojected region is a substrate region, and a projected region is a metal layer region on the aluminum metal layer. In FIG. 5A, a time of supplying a chalcogen precursor is 1 second, and a time of supplying a transition metal precursor is 5 seconds, and thus a two-dimensional TMC film may be patterned only on the metal layer region. FIG. 5B shows Raman spectra with respect to the substrate region and the metal layer region. Referring to FIG. 5B, it may be confirmed that a region having a Raman intensity peak of a two-dimensional TMC film is detected only on the metal layer. In FIG. 5B, when the region from which a Raman intensity peak of a two-dimensional TMC film is synthesized, it may be confirmed that a synthesis image as in FIG. 5C is the result. In this regard, it may be confirmed that a fine patterning of the two-dimensional TMC film may be performed, where the two-dimensional TMC film is formed on a patterned metal layer.

Figure 6A:
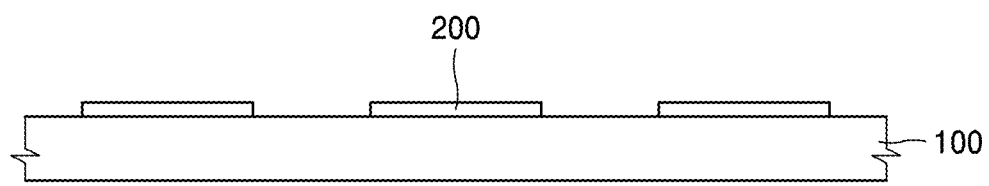
FIGS. 6A to 6C are cross-sectional views illustrating a method of manufacturing a device containing a two-dimensional TMC film, according to an example embodiment.
Figure 6B:
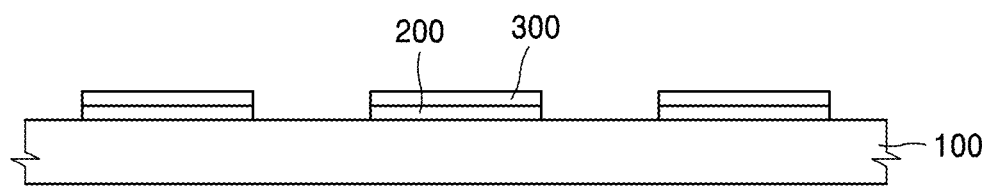
Figure 6C:
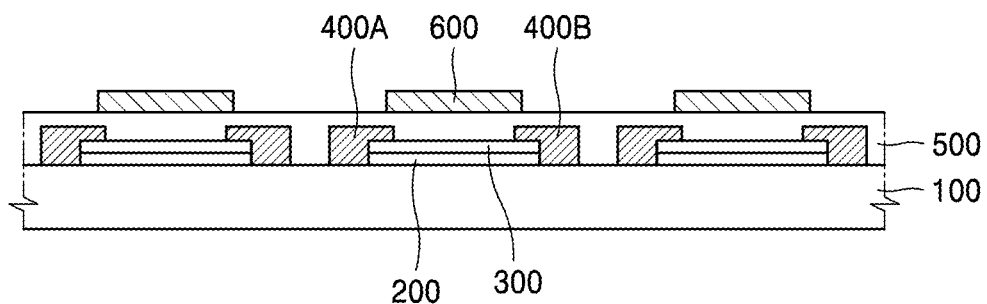

FIGS. 6A to 6C are cross-sectional views illustrating a method of manufacturing a device containing a two-dimensional TMC film, according to an example embodiment.

Referring to FIG. 6A, a patterned metal layer 200 may be formed on a substrate 100. For example, the substrate 100 may be a large-area substrate in a wafer scale, and the metal layer 200 may be placed on the substrate 100. The metal layer 200 may include a pattern.

Referring to FIG. 6B, a two-dimensional TMC film 300 may be formed on the patterned metal layer 200. Here, a time of supplying a transition metal precursor and a time of supplying a chalcogen precursor may be controlled, as described above, to achieve patterning and uniformity of the two-dimensional TMC film 300.

Referring to FIG. 6C, a device portion including the patterned two-dimensional TMC film 300 may be formed on the substrate 100. For example, a source electrode 400A and a drain electrode 400B, each in contact with an end of the patterned two-dimensional TMC film 300, may be formed. A gate insulating layer 500 may be formed on the patterned two-dimensional TMC film 300, and a gate electrode 600 may be formed on the gate insulating layer 500. Through this process, a transistor device including the two-dimensional TMC film 300 may be manufactured. However, the method of manufacturing a device with reference to FIGS. 6A to 6C is merely an example and may be variously modified.

Although many matters have been described above in detail, it should be understood that they are not intended to limit the scope of one or more embodiments and are provided to give examples. For example, it would be apparent to those of ordinary skill in the art that various changes may be made to the method of growing a two-dimensional TMD film and the method of manufacturing a device using the two-dimensional TMD thin film, described with reference to the figures. Accordingly, the scope of one or more embodiments should be determined not by the example embodiments set forth herein but by the technical ideas recited in the appended claims.

According to one or more embodiments, a method of growing a two-dimensional TMC film capable of securing uniformity and high quality using a self-pattern method may be provided.

A method of growing a two-dimensional TMC film capable of simultaneously performing deposition and etching of the two-dimensional TMC film by controlling a supply time of a transition metal precursor may be provided.

A method of growing a two-dimensional TMC film by controlling a deposition rate of the two-dimensional TMC film may be provided.

A device applying the method of growing a two-dimensional TMC film may be provided.

It should be understood that embodiments described herein should be considered in a descriptive sense only and not for purposes of limitation. Descriptions of features or aspects within each example embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of growing a two-dimensional transition metal chalcogenide (TMC) film, the method comprising:
   placing a patterned metal layer on a surface of a substrate;
   supplying a chalcogen precursor to a reaction chamber with the substrate;
   supplying 0.1 µg to 2 µg of a transition metal precursor to the reaction chamber such that a ratio of the transition metal precursor and the chalcogen precursor is within a range about $8*10^{-6}$ to about $1.6*10^{-4}$; and
   evacuating the chalcogen precursor, the transition metal precursor, and by-products generated therefrom from the reaction chamber after the supplying of the transition metal precursor,
   wherein the supplying of the chalcogen precursor; the supplying of the transition metal precursor; and the evacuating of the chalcogen precursor, the transition metal precursor, and the by-products generated therefrom are sequentially, periodically, and repeatedly performed.

2. The method of claim 1, wherein, after the 0.1 µg to 2 µg of the transition metal precursor is supplied to the reaction chamber, the two-dimensional TMC film is only on the metal layer.

3. The method of claim 1, wherein the substrate comprises at least one of Si, $SiO_2$, $Al_2O_3$, MgO, SiC, $Si_3N_4$, glass, quartz, sapphire, graphite, graphene, polyimide copolymer, polyimide, polyethylene naphthalate (PEN), fluoropolymer (FEP), polyethylene terephthalate (PET), and a TMC material.

4. The method of claim 1, wherein the metal layer comprises at least one selected from Al, Ni, Ti, Zr, Cr, Ta, Nb, and W.

5. The method of claim 1, wherein the periodic repetition is performed 100 to 300 times.

6. The method of claim 5, wherein a thickness of the two-dimensional TMC film is in a range of 1 nm to 3 nm.

7. The method of claim 1, wherein a temperature for the growing of the two-dimensional TMC film is maintained in a range of 200° C. to 600° C.

8. The method of claim 1, wherein the chalcogen precursor comprises a precursor material including at least one of S, Se, Te, Po, and Lv.

9. The method of claim 1, wherein the transition metal precursor comprises a precursor material including at least one of a metal element of Groups 4B, 5B, 6B, and 7B.

10. The method of claim 1, wherein the transition metal precursor comprises at least one of F, Cl, Br, and I.

11. The method of claim 1, wherein a material of the two-dimensional TMC film is represented by MX2,
wherein M is one of Mo, W, Nb, V, Ta, Ti, Zr, Hf, Tc, and Re, and
wherein X is one of S, Se, Te, Po, and Lv.

12. The method of claim 1, wherein the growing of the two-dimensional TMC film uses an atomic layer deposition (ALD) process.

13. The method of claim 1, wherein at least one of the transition metal precursor and the chalcogen precursor further comprise a precursor material of a doping element.

14. The method of claim 1, wherein the two-dimensional TMC film is formed on a wafer having a size of 6 inches or more.

15. A method of manufacturing a device containing a two-dimensional transition metal chalcogenide (TMC) film, the method comprising:
growing a two-dimensional TMC film on a substrate, the growing of the two-dimensional TMC film including
placing a patterned metal layer on a surface of the substrate,
supplying a chalcogen precursor to a reaction chamber with the substrate,
supplying 0.1 μg to 2 μg of a transition metal precursor to the reaction chamber such that a ratio of the transition metal precursor and the chalcogen precursor is within a range about $8*10^{-6}$ to about $1.6*10^{-4}$, and
evacuating the chalcogen precursor, the transition metal precursor, and by-products generated therefrom from the reaction chamber after the supplying of the transition metal precursor; and
forming an electrode on the two-dimensional TMC film,
wherein the supplying of the chalcogen precursor; the supplying of the transition metal precursor; and the evacuating of the chalcogen precursor, the transition metal precursor, and the by-products generated therefrom are sequentially, periodically, and repeatedly performed.

16. The method of claim 15, wherein the device containing the two-dimensional TMC film comprises at least one of a transistor, a diode, an optoelectronic device, a tunneling device, a logic device, and a memory device.

17. The method of claim 15, wherein a thickness of the two-dimensional TMC film is in a range of 1 nm to 3 nm.

18. The method of claim 15, wherein a material of the two-dimensional TMC film is represented by MX2,
wherein M is one of Mo, W, Nb, V, Ta, Ti, Zr, Hf, Tc, and Re, and X is one of S, Se, Te, Po, and Lv.

* * * * *